United States Patent
Tseng

(10) Patent No.: US 6,440,869 B1
(45) Date of Patent: Aug. 27, 2002

(54) METHOD OF FORMING THE CAPACITOR WITH HSG IN DRAM

(75) Inventor: Horng-Huei Tseng, Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 88 days.

(21) Appl. No.: 09/604,010

(22) Filed: Jun. 26, 2000

(51) Int. Cl.⁷ .............................. H01L 21/00
(52) U.S. Cl. ................ 438/734; 216/38; 216/79; 438/723; 438/740; 438/743
(58) Field of Search .............. 438/634, 637, 438/672, 719, 720, 723, 724, 725, 737, 738, 740, 743; 216/38, 67, 79

(56) References Cited

U.S. PATENT DOCUMENTS 6,187,623 B1 * 2/2001 Hirota et al. .......... 438/740 X
6,200,898 B1 * 3/2001 Tu ........................ 438/723 X

* cited by examiner

Primary Examiner—William A. Powell
(74) Attorney, Agent, or Firm—Bacon & Thomas

(57) ABSTRACT

The present invention discloses the method of forming the bottom electrode with HSG (hemispherical grain) layer on substrate, said substrate comprising a word line and an active region, said method comprising the steps of: depositing a confomal etch stop layer on said active region and said word line; forming a dielectric layer on said etch stop layer with planar top surface; forming a contact hole in said. dielectric layer and said etch stop layer to expose portions of said active region and said word line; depositing a first conductive layer on the surface of the contact hole; forming a hemishperical grain (HSG) layer on said first conductive layer; and removing said dielectric layer.

17 Claims, 7 Drawing Sheets

METHOD OF FORMING THE CAPACITOR WITH HSG IN DRAM

FIELD OF THE INVENTION

The present invention generally relates to a method for forming a capacitor in DRAM, particularly relates to a method of forming the hemispherical silicon grain (HSG) with strong mechanical strength.

BACKGROUND OF THE INVENTION

As the semiconductor memory device becomes more highly integrated, the area occupied by a capacitor of a DRAM storage cell typically shrinks and it will cause the capacitance reduce of the capacitor. Owing to the leakage current, however, it is necessary to refresh the capacitor continuously in order to keep the stored state, especially when the capacitance of the capacitor is limited. Furthermore, the area reduction of the capacitor occupied will cause the capacitor to be disturbed by the alpha particle more easily.

Until now, there has been much effort directed to keep a relatively large capacitance of the capacitors in order to achieve a high signal to noise ratio in reading the memory cell and to reduce soft errors (due to alpha particle interference) as the memory device becomes highly integrated. As the followings, there are some approaches to increase the storage capability of the capacitor while the area occupied by the capacitor maintains small enough. (1) substituting a high capacitance material for traditional material to increase the storage charges per unit area of the capacitor, for example: the substitution the of $Ta_2O_5$ and $TiO_2$ for $SiO_2$. (2) decreasing the dielectric layer thickness of the capacitor: because of the Fowler-Nordheimn tunneling effect, the dielectric layer thickness is limited to a minimum value and one can not improve the capacitor too much by this method. (3) variation the shape of the capacitor electrodes: the capacitor may have protrusions, cavities, etc., to increase the surface area of the capacitor electrode. (4) increasing the contact area between the conductive layer acting as the electrode of the capacitor and the dielectric layer: the surface between the dielectric layer and the conductive layer can be varied to a ragged type surface and not be even a plain surface anymore.

The aforementioned third approach, it has been widely used and a crown-shaped or an U-shaped capacitor has been developed. For the last one method, one type of the surface variation is a ragged polysilicon layer or hemispherical grain (HSG) polysilicon. The combination implementing of these two methods is as following description.

FIG. 1 is a cross section view illustrating the step where capacitor fabrication begins. There are two word lines structure 102, active areas 110 and field oxide region 103. The active area 110 is isolated from other active area in a DRAM array by a field oxide region 103, and one of the word line structure 102 is positioned over field oxide region 103.

As shown in FIG. 1, the word line structure 102 comprise a first silicon oxide layer 106, a polysilicon layer 108 formed on the first silicon layer 106, a refractory layer 105 formed on the polysilicon layer 108, a horizontal spacer layer 104 formed one the refactory layer 105 and a pair of sidewall spacer 112 formed vertically along the side wall of the word line structure 102. The spacer 112 and 104 is silicon nitride or silicon dioxide material, and are used to protect the word line structure 102 from any etching process or act as a shield to prevent dopants atoms entering the channel region.

Furthermore, during the operation of the DRAM, the spacer 112 and 104 provide electrical isolation between the gate electrode 102 and the active area 110.

FIG. 2 which is a cross sectional view of a semiconductor substrate illustrates the steps of forming a etch stop layer 116, sacrificial layer 118, masking layer 120 and a photoresist layer 122 in the prior art. An conformal etch stop layer 116, comprising silicon dioxide layer preferably, is formed on the substrate 100 in FIG. 1. Then, a sacrificial layer 118 with preferred polysilicon material is deposited conformally on the etch stop layer 116. The preferred polysilicon sacrificial layer 118 may reduce the stress during process. Following the sacrificial layer 118 deposition, a masking layer 120 preferably comprising borophosphosilicate glass (BPSG) is deposited and planarized to a selected thickess sufficient to fill all the gaps between the adjacent word line structure 102 and to coat the word line structure 102 so as to provide a planar upper surface 121. Afterward, a photoresist layer 122 is deposited on the masking layer 120.

Referring to FIG. 3, which is a cross sectional view of a semiconductor substrate, illustrates the step of forming a contact hole 126 in the prior art. The photoresist layer 122 is patterned using photolithography process to create a contact hole 126 in the photoresist layer 122. Next, the masking layer 120 and the sacrificial layer 118 are etched in sequence by using the patterned photolithograpy layer 122, and the contact hole 126 is created in the masking layer 120 and the sacrificial layer 118.

FIG. 4 which is a cross sectional view of a semiconductor substrate illustrates the steps of removing the etch stop layer 116 and forming a HSG polysilicon layer 128. The etch stop layer 116 is processed by dry etching process to expose the active area 110 and part of the word line structure 102. Then, the remaining photoresist layer 122 is removed by dry etching process and a hemispherical grain (HSG) polysilicon layer 128 is then formed on the surface of the contact hole 126 and on the upper surface of the masking layer 120. The HSG polysilicon layer 128 forms the storage plate or the bottom electrode of the future capacitor.

Referring to FIG. 5, after the formation of the HSG polysilicon layer 128, the substrate 100 is process with CMP (chemical mechanical planarization). The HSG polysilicon layer 128 on the upper surface of the masking layer 120 is removed.

Referring to FIG. 6, following the CMP step, the remaining masking layer 120 and the remaining sacrificial layer 118 are removed in sequence by selective etching process. The wall portion 127 of the HSG polysilicon layer 128 significantly increases the surface area of the contact area. However, the connection of every hemispherical grain on the wall portion 127 is located on the connection of the grain edge and is very weak, the wall portion 127 is insufficient with the mechanical strength. The insufficient mechanical strength may induce the crack of the wall portion 127, and lose the capability of the capacitor formed by changing the shape of the capacitor and increasing the contact area.

Therefore, it is really required to improve the mechanical strength.

SUMMARY OF THE INVENTION

The present invention provides a manufacturing process for increasing the mechanical strength of the HSG layer.

In the present invention, two word line structures, active areas are provided on the substrate. First, a conformal etch stop layer is deposited on the active region and said word line. A sacrificial layer and a mask layer is formed on the etch stop layer. Then, the substrate is process with CMP to planarize the top surface of the mask layer. Then, a contact hole is formed in the sacrificial layer, mask layer and the etch stop layer to expose portions of the active region and the word lines structures.

A polysilicon layer with the thickness about 50 to 2000 angstroms is formed on the surface of the contact hole and the top surface of the masking layer. Next, a hemishperical grain (HSG) layer with the thickness about 10 to 500 angstroms is formed on the polysilicon layer. Then, the substrate is process with CMP to remove the portions of the polycilicon layer and the HSG layer on the top surface of the masking layer. And the masking layer and the sacrificial layer are removed by etching process. Finally, a dielectric layer is deposited on the HSG layer and a conductive layer is deposited on the dielectric layer to form the capacitor.

BRIEF DESCRIPTION OF THE DRAWINGS

The objects, features and advantages of the present invention will be apparent from the following more particularly description of the invention illustrated in the accompanying drawings, in which.

DETAILED DESCRIPTION OF THE PREFERRED EMBODIMENT

Figure 1:
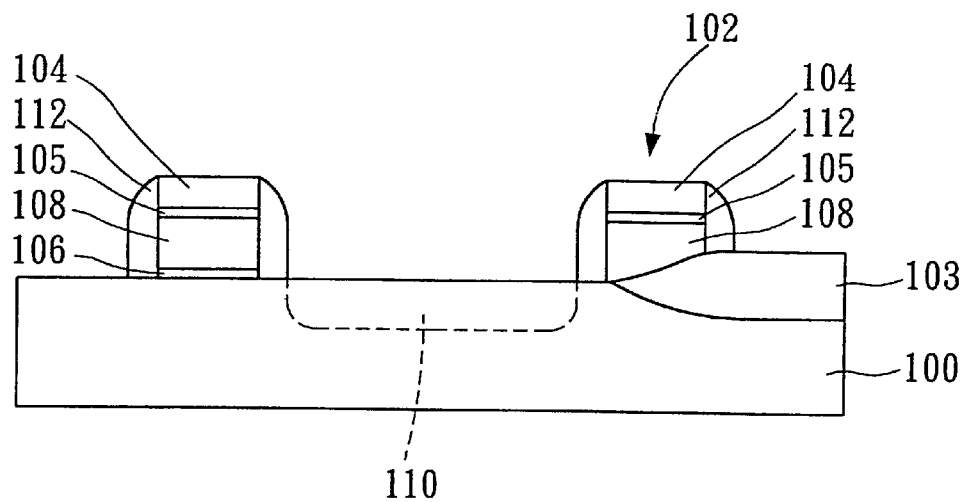
FIG. 1 is a cross sectional view illustrating the step where capacitor fabrication begins. And shows two word lines structure, active areas and field oxide region on the substrate in the prior art.
Figure 2:
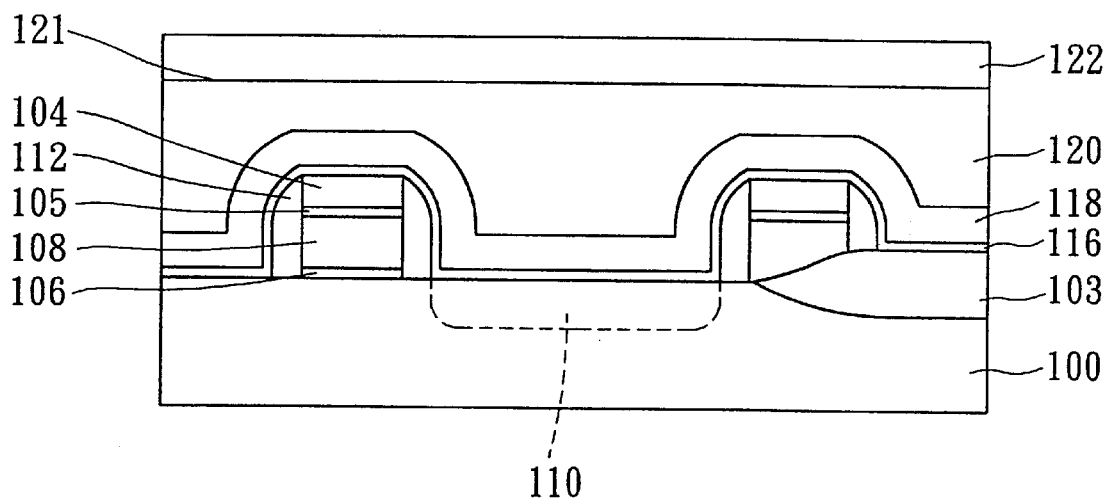
FIG. 2 which is a cross sectional view of a semiconductor substrate illustrates the steps of forming a etch stop layer, sacrificial layer, masking layer and a photoresist layer in the prior art.
Figure 3:
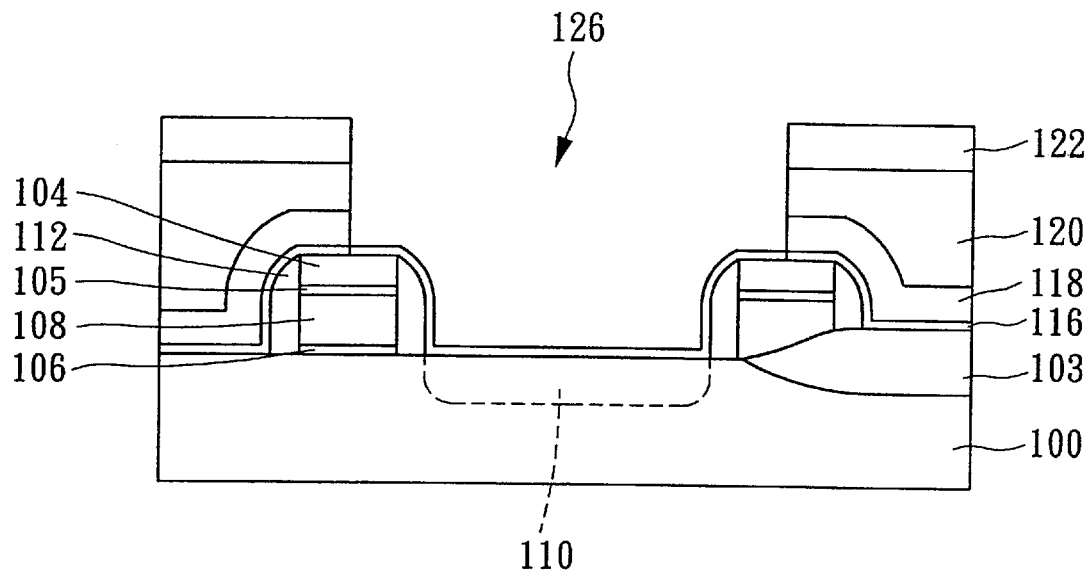
FIG. 3, which is a cross sectional view of a semiconductor substrate, illustrates the step of forming a contact hole in the prior art.
Figure 4:
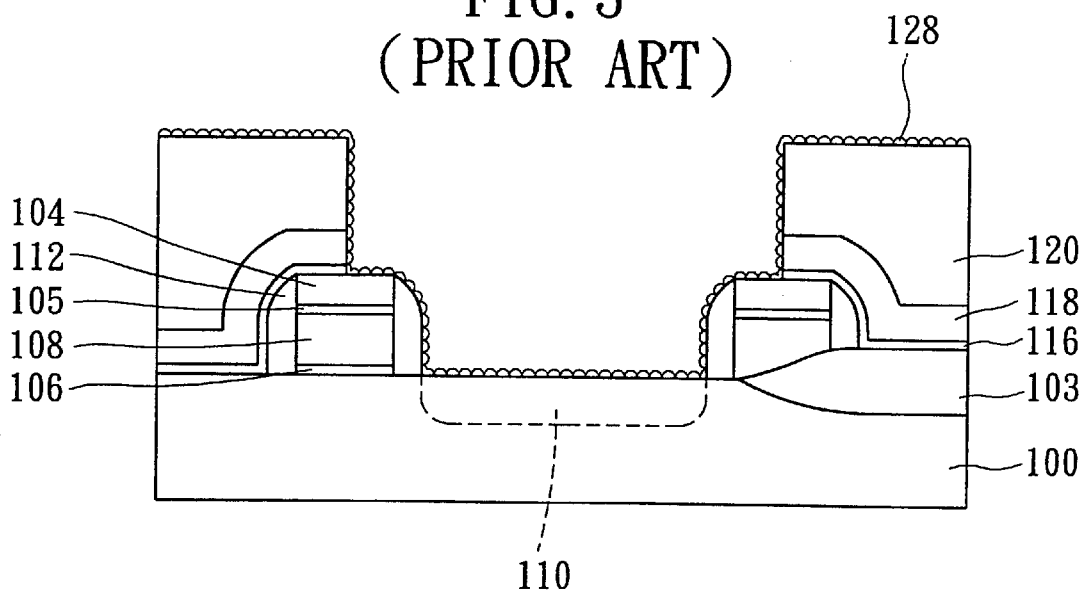
FIG. 4 which is a cross sectional view of a semiconductor substrate illustrates the steps of removing the etch stop layer and forming a HSG polysilicon layer in the prior art.
Figure 5:
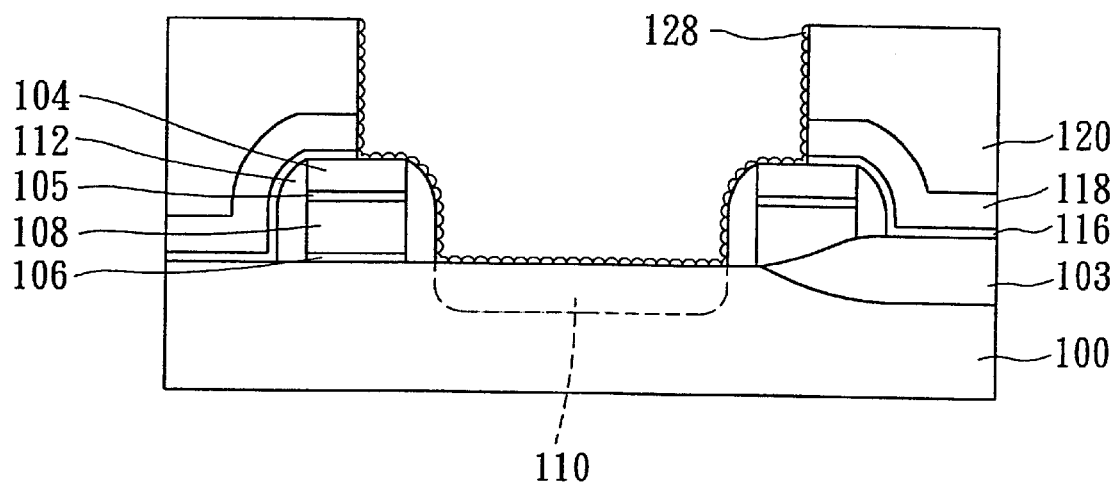
FIG. 5 is a cross sectional view of a semiconductor wafer illustrating the steps of processing CMP in the prior art.
Figure 6:
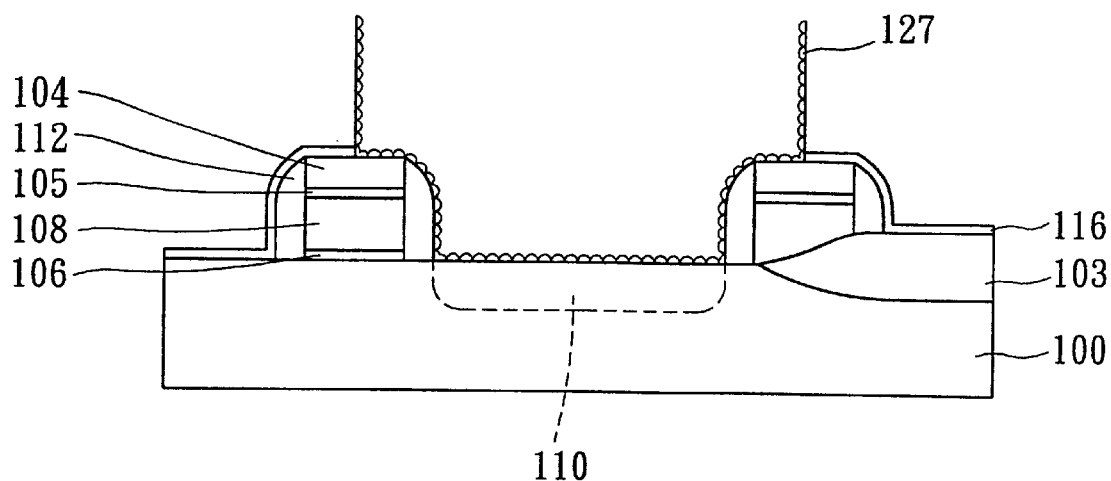
FIG. 6 is a cross sectional view of a semiconductor wafer illustrating the steps of remaining masking layer and the remaining sacrificial layer are removed in sequence by selective etching process art in the prior art.

Hereinafter, the preferred embodiments of the invention will be described with reference to accompanying drawing wherein like reference numerals designate like parts, respectively.

Figure 7:
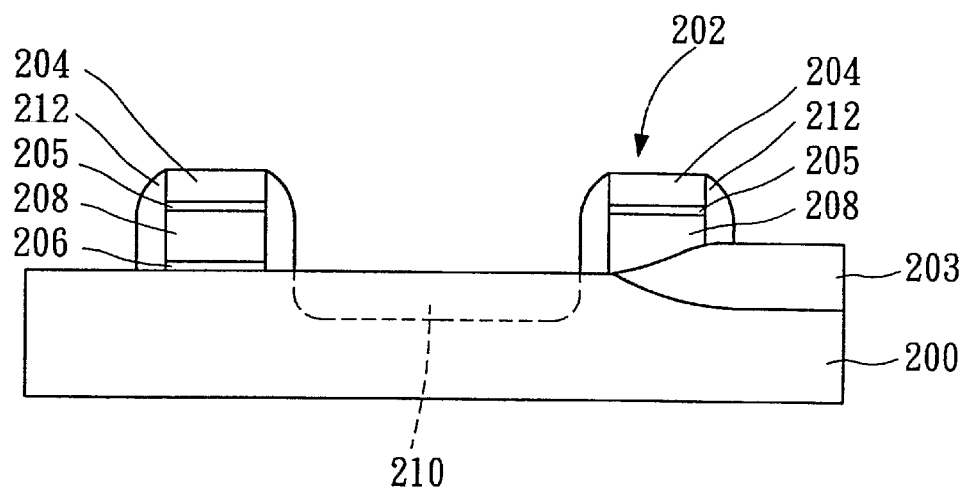
FIG. 7 is a cross sectional view illustrating the step where capacitor fabrication begins. And shows two word lines structure, active areas and field oxide region on the substrate in the present invention.

FIG. 7 is a cross section view illustrating the step where capacitor fabrication begins in the present invention. There are two word lines structure 202, active areas 210 and field oxide region 203. The active areas 210 is isolated from other active areas in a DRAM array by a field oxide region 203, and one of the word line structure 202 is positioned over field oxide region 203.

As shown in FIG. 7, the word line structure 202 comprises a first silicon oxide layer 206, a polysilicon layer 208 formed on the first silicon layer 206, a refractory layer 205 formed on the polysilicon layer 208, a horizontal spacer layer 204 formed one the refractory layer 205 and a pair of sidewall spacer 212 formed vertically along the side word of the word line structure 202. The spacer 212 and 204 is silicon nitride or silicon dioxide material, and are used to protect the word line structure 202 from any etching process or act as a shield to prevent dopants atoms entering the channel region. Furthermore, during the operation of the DRAM, the spacer 212 and 204 provide electrical isolation between the gate electrode 202 and the active area 210.

Figure 8:
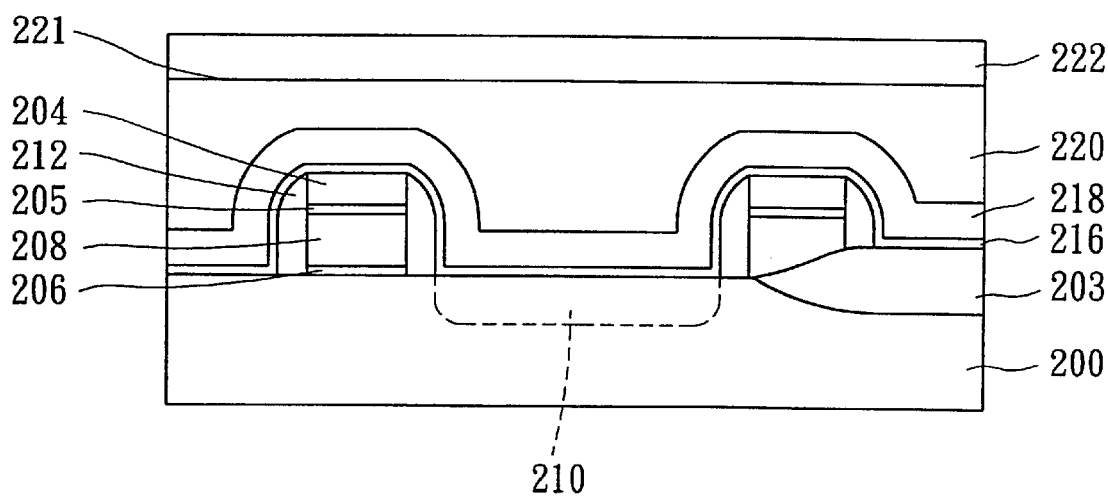
FIG. 8 which is a cross sectional view of a semiconductor substrate illustrates the steps of forming a etch stop layer, sacrificial layer, masking layer and a photoresist layer in the present invention.

FIG. 8 which is a cross sectional view of a semiconductor substrate illustrates the steps of forming a etch stop layer 216, sacrificial layer 218, masking layer 220 and a photoresist layer 222 in the present invention. An conformal etch stop layer 216, comprising silicon dioxide layer preferably, is formed on the substrate 200 in FIG. 7. Then, a sacrificial layer 218 with preferred polysilicon material is deposited conformally on the etch stop layer 216. The preferred polysilicon sacrificial layer 218 may reduce the stress during process. Following the sacrificial layer 218 deposition, a masking layer 220 preferably comprising borophosphosilicate glass (BPSG) is deposited and planarized to a selected thickness sufficient to fill all the gaps between the adjacent word line structure 202 and to coat the word line structure 202 so as to provide a planar upper surface 221. Afterward, a photoresist layer 222 is deposited on the masking layer 220.

Figure 9:
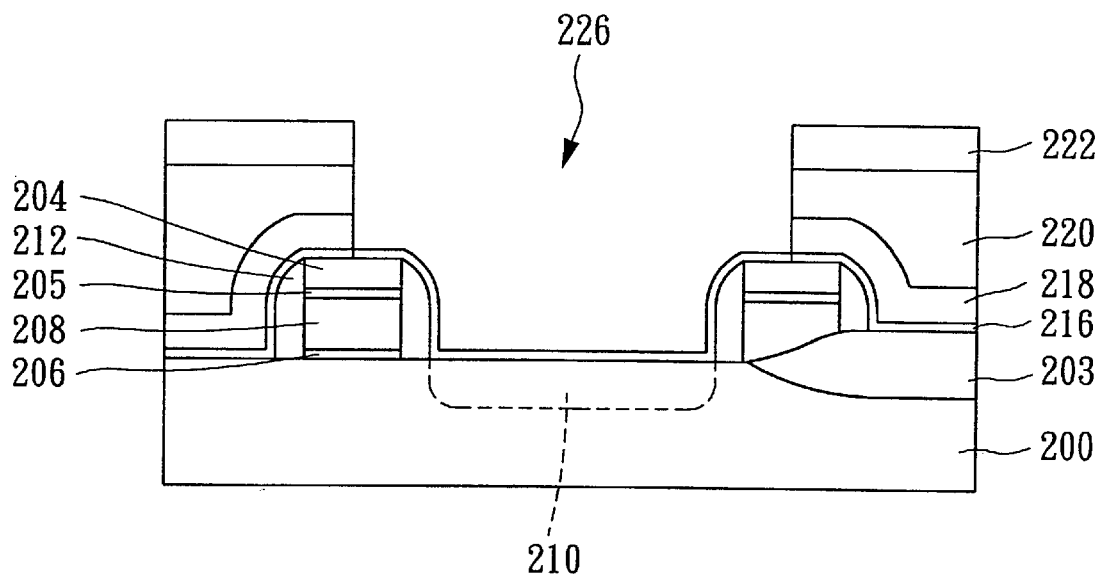
FIG. 9 which is a cross sectional view of a semiconductor substrate, illustrates the step of forming a contact hole in the present invention.

Referring to FIG. 9, which is a cross sectional view of a semiconductor substrate, illustrates the step of forming a contact hole 226 in the present invention. The photoresist layer 222 is patterned using photolithography process to create a contact hole 226 in the photoresist layer 222. Next, the masking layer 220 and the sacrificial layer 218 are etched in sequence by using the patterned photolithograpy layer 222 and as a masking layer, and the contact hole 226 is created in the masking layer 220 and the sacrificial layer 218.

Figure 10:
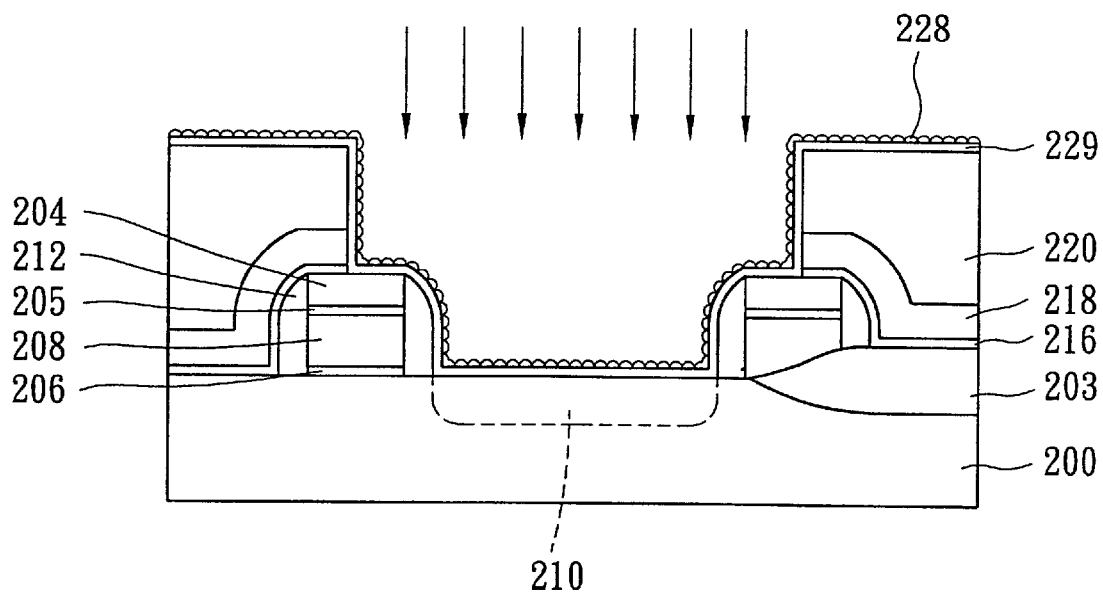
FIG. 10 which is a cross sectional view of a semiconductor substrate illustrates the steps of forming a first conductive layer and a HSG polysilicon layer in the present invention.

FIG. 10 which is a cross sectional view of a semiconductor substrate illustrates the steps of forming a first conductive layer 229 and a HSG polysilicon layer 228. The etch stop layer 216 is processed by dry etching process to expose the active area 210 and part of the word line structure 202. The remaining photoresist layer 222 is also removed by dry etching process. Then, a first conductive layer 229 is formed conformably over on the surface of the contact hole 226 and on the top surface of the sacrificial layer 220. The first conductive layer 229 can be an amorphous silicon layer. In the preferred embodiments, the first conductive layer 229 is a doped polysilicon layer, for example, using a standard chemical vapor deposition (CVD) process with in-situ doped dopants. The thickness of the first conductive layer 229 is between about 50 to 2000 angstroms to provide the sufficient mechanical strength for the HSG layer 228, which will be formed later.

A HSG layer 228 is then formed on the first conductive layer 229. The HSG layer 228, which is preferably an doped silicon layer, forms size with the thickness ranging from about 10 to 500 angstroms in the case.

In the preferred embodiments of forming HSG layer 228, a seed layer may be needed for the formation of grain silicon. A thin titanium nitride (TiN) layer can be conformably formed on the first conductive layer 229 with suitable processes. In this embodiment, a low pressure chemical vapor deposition (LPCVD) is preferably used to achieve excellent conformity and thickness controllability. The TiN layer is preferably deposited to a thickness between about 100 to 300 angstroms. Having the TiN layer as a seed layer, the nucleation sites in forming the HSG layer 228 are provided.

In the case without employing the TiN layer, silicon particles on the surface of the first conductive layer 229 can also be employed as the nucleation sites. During forming the HSG layer 228, deposited HSG polysilicon nucleates on the surface of the seed layer, or in the gas phase, to form a great number of polysilicon nodules over the surface of the first conductive layer 229. While the polysilicon deposition is continued further, these nodules grow to become grains as shown in FIG. 10. The composition of first conductive layer 229 and hemispherical silicon grain (HSG) layer 228 is the bottom electrode of the capacitor to be completed.

Figure 11:
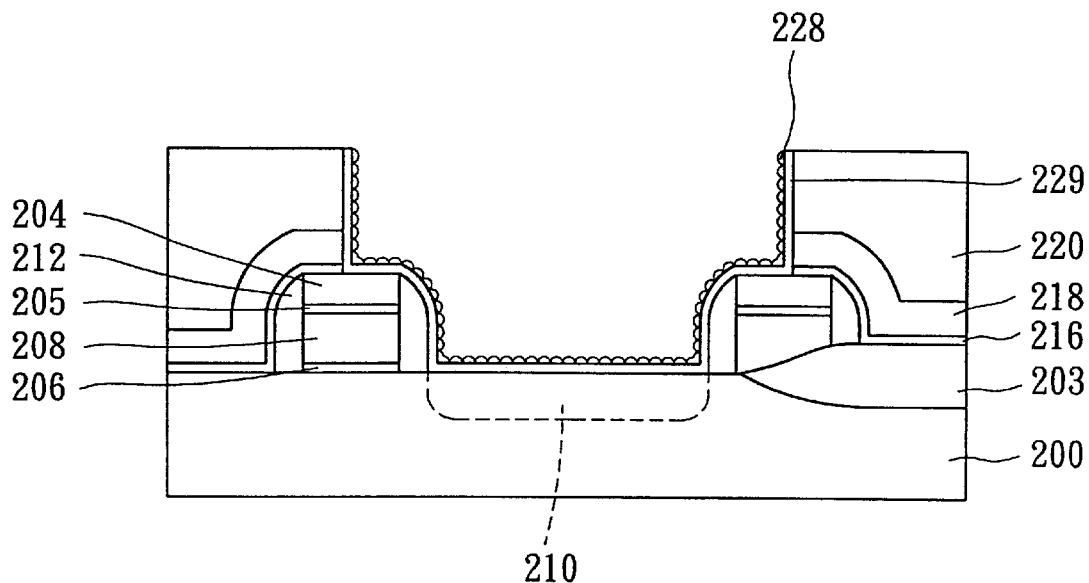
FIG. 11 is a cross sectional view of a semiconductor wafer illustrating the steps of processing CMP in the present invention.

Referring to FIG. 11, the substrate 200 is process with CMP (chemical mechanical planarization). The HSG polysilicon layer 228 and the first conductive layer 229 on the top surface of the masking layer 220 is removed.

Figure 12:
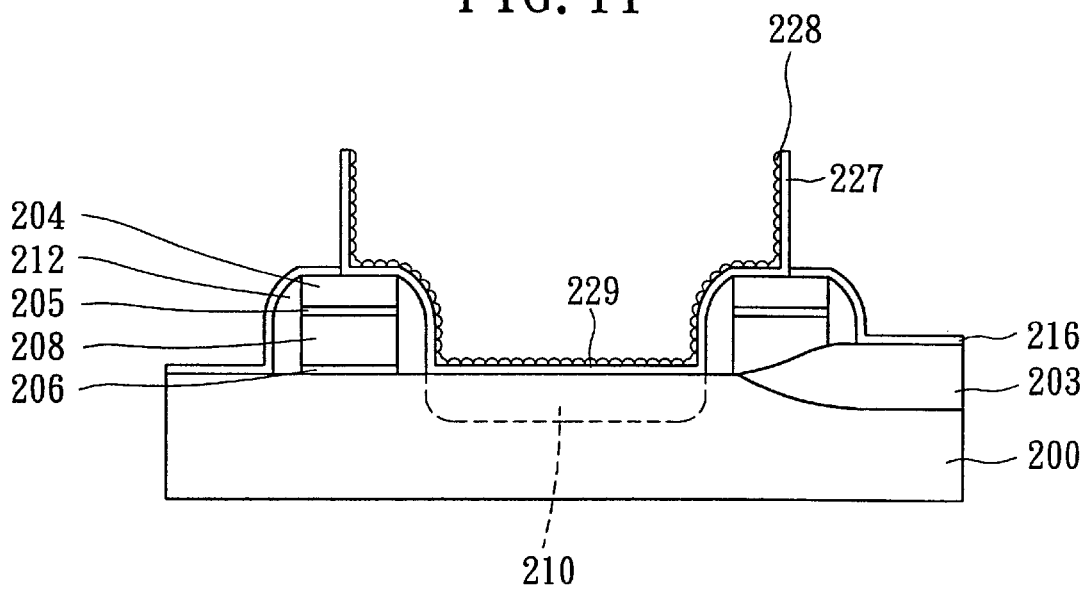
FIG. 12 is a cross sectional view of a semiconductor wafer illustrating the steps of remaining masking layer and the remaining sacrificial layer are removed in sequence by selective etching process art in the present invention.

Referring to FIG. 12, following the CMP step, the remaining masking layer 220 and the remaining sacrificial layer 218 are removed in sequence by selective etching process. The wall portion 227 of the HSG polysilicon layer 228 significantly increases the surface area of the contact area. And in the present invention, the connection of every hemispherical grain on the wall portion 227 is not only located on the connection of the grain edge but also located on the connection between the first conductive layer 229 and HSG layer 228. Therefore, the mechanical strength of the wall portion 227 is increased.

Figure 13:
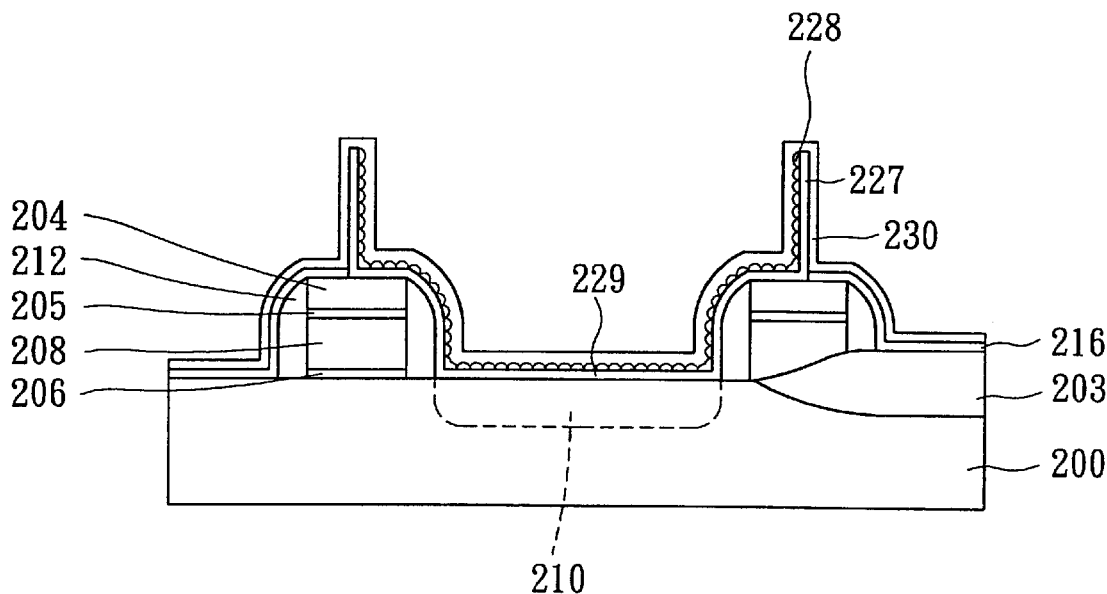
FIG. 13 which is a cross sectional view of a semiconductor substrate illustrates the steps of forming a dielectric layer in the present invention.

Referring to FIG. 13, a dielectric layer 230 is formed conformably on the substrate 200. The dielectric layer 230 is the inter-electrode dielectric film of the capacitor that is to be fabricated. In the preferred embodiment of the present, the third dielectric layer 230 is the dielectric film of the capacitor can be stacked oxide-nitride-oxide (ONO) film, silicon nitride, $Ta_2O_5$, $TiO_2$, BST ($BaSiTiO_3$), PZT (lead zirconate titanate) and the thickness is about 10 to 1000 angstroms.

Figure 14:
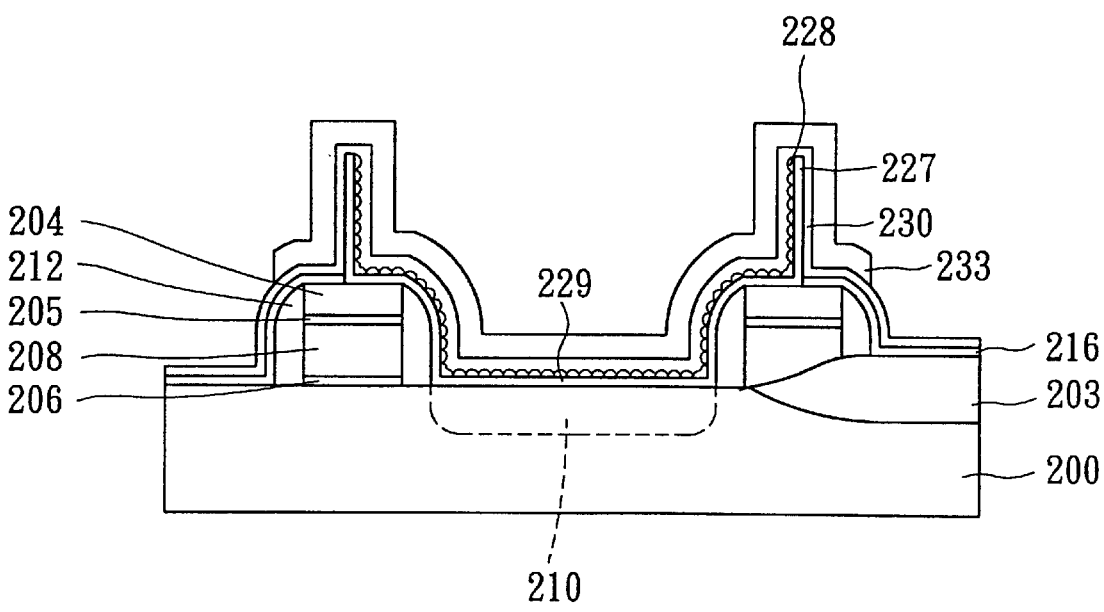
FIG. 14 which is a cross sectional view of a semiconductor substrate illustrates the steps of forming a top electrode in the present invention.

Referring to FIG. 14, a second conductive layer 233, acting as the upper electrode of the capacitor, is formed over the dielectric layer 230. The preferred embodiment according to the present invention, the second conductive layer 233 can be polysilicon, tungsten or aluminum and the thickness of the second conductive layer is about 100 to 3000 angstroms. Finally, the second conductive layer 233 is patterned to define the upper electrode.

From the above description, the present invention provides a method to improve the mechanical strength of the HSG layer 228. The connection of every hemispherical grain on the wall portion 227 is not only located on the connection of the grain edge but also located on the connection between the first conductive layer 229 and HSG layer 228. Therefore, in the present invention, the mechanical strength of the wall portion 227 is increased effectively.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A method of forming the bottom electrode with HSG (hemispherical grain) layer on substrate, said substrate comprising a word line and an active region, said method comprising the steps of:

depositing a conformal etch stop layer on said active region and said word line;

forming a dielectric layer on said etch stop layer with planar top surface;

forming a contact hole in said dielectric layer and said etch stop layer to expose portions of said active region and said word line;

depositing a conductive layer on the surface of the contact hole;

forming a hemishperical grain (HSG) layer on said conductive layer; and removing said dielectric layer.

2. The method according to claim 1, wherein said conductive layer has the thickness range about 50 to 2000 angstrom.

3. The method according to claim 1, wherein said conductive layer comprises TiN layer.

4. The method according to claim 1, wherein said conductive layer is doped polysilicon layer.

5. The method according to claim 1, wherein said HSG layer has the thickness range about 10 to 500 angstroms.

6. The method according to claim 1, wherein said dielectric layer is polysilicon layer.

7. The method according to claim 1, wherein said dielectric layer is PSG layer.

8. A method of forming a capacitor with HSG (hemispherical grain) layer substrate, said substrate comprising a word line and a active region, said method comprising the steps of:

depositing a conformal etch stop layer on said active region and said word line;

forming a sacrificial layer on said etch stop layer;

depositing a mask layer with planar top surface on said sacrificial layer;

forming a contact hole in said sacrificial layer, said mask layer and said etch stop layer to expose portions of said active region and said word line;

depositing a silicon layer on the surface of the contact hole;

forming a hemishperical grain (HSG) layer on said silicon layer;

removing said masking layer and said sacrificial layer;

forming a dielectric layer on said HSG layer; and forming a conductive layer on said dielectric layer.

9. The method according to claim 8, wherein said silicon layer has the thickness range about 50 to 2000 angstrom.

10. The method according to claim 8, wherein said HSG layer has the thickness range about 10 to 500 angstroms.

11. The method according to claim 8, wherein said dielectric layer comprises a material selected from the group consisted of stacked oxide-nitride-oxide (ONO) film, silicon nitride.

12. The method according to claim 8, wherein said dielectric layer comprises a material selected from the group consisted of stacked $Ta_2O_5$, $TiO_2$.

13. The method according to claim 8, wherein said dielectric layer comprises a material selected from the group consisted of stacked BST ($BaSiTiO_3$), PZT (lead zirconate titanate).

14. The method according to claim 8, wherein said silicon layer comprises polysilicon.

15. The method according to claim 8, wherein said silicon layer comprises amorphous silicon.

16. The method according to claim 8, wherein said sacrificial layer is polysilicon layer.

17. The method according to claim 8, wherein said masking layer is BPSG layer.

\* \* \* \* \*